United States Patent
Andoh et al.

(10) Patent No.: US 6,855,593 B2
(45) Date of Patent: Feb. 15, 2005

(54) TRENCH SCHOTTKY BARRIER DIODE

(75) Inventors: Kohji Andoh, El Segundo, CA (US); Davide Chiola, Marina del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/193,783

(22) Filed: Jul. 11, 2002

(65) Prior Publication Data

US 2004/0007723 A1 Jan. 15, 2004

(51) Int. Cl.⁷ .......................................... H01L 21/8234
(52) U.S. Cl. ...................... 438/237; 438/570; 438/576; 438/582; 438/583; 438/963
(58) Field of Search .................. 438/237, 576, 438/582, 583, 963, FOR 198, FOR 336, FOR 337, FOR 338, FOR 339, 570; 257/471, E33.051, E29.148, E29.338

(56) References Cited

U.S. PATENT DOCUMENTS

| | | | |
|---|---|---|---|
| 3,363,153 A | 1/1968 | Zloczower | |
| 4,219,835 A | 8/1980 | van Loon et al. | |
| 4,646,115 A | 2/1987 | Shannon et al. | |
| 4,647,957 A | * 3/1987 | Coquin et al. | 257/374 |
| 4,994,883 A | 2/1991 | Chang et al. | |
| 5,365,102 A | 11/1994 | Mehrotra et al. | |
| 5,612,567 A | 3/1997 | Baliga | |
| 6,049,108 A | * 4/2000 | Williams et al. | 257/341 |
| 6,078,090 A | * 6/2000 | Williams et al. | 257/476 |
| 6,441,454 B2 | 8/2002 | Hijzen et al. | |
| 6,466,634 B1 | * 10/2002 | O'Toole et al. | 375/374 |
| 6,541,312 B2 | * 4/2003 | Cleeves et al. | 438/131 |
| 2001/0006831 A1 | * 7/2001 | Luo | 438/138 |
| 2003/0010144 A1 | * 1/2003 | Petzold | 74/335 |

* cited by examiner

Primary Examiner—George Fourson
Assistant Examiner—Michelle Estrada
(74) Attorney, Agent, or Firm—Ostrolenk, Faber, Gerb & Soffen, LLP

(57) ABSTRACT

A fabrication process for a Schottky barrier structure includes forming a nitride layer directly on a surface of an epitaxial ("epi") layer and subsequently forming a plurality of trenches in the epi layer. The interior walls of the trenches are then deposited with a final oxide layer without forming a sacrificial oxide layer to avoid formation of a beak bird at the tops of the interior trench walls. A termination trench is etched in the same process step for forming the plurality of trenches in the active area.

15 Claims, 4 Drawing Sheets

US 6,855,593 B2

TRENCH SCHOTTKY BARRIER DIODE

FIELD OF THE INVENTION

The present invention relates to semiconductor devices, and more particularly to a novel trench Schottky diode and process for fabricating a trench Schottky diode.

BACKGROUND OF THE INVENTION

Schottky diodes are very well known and are made with different topologies. The most common is a planar topology. A trench topology is also known as typically shown in Baliga patent 5,612,567. The process of manufacture of a trench type Schottky diode requires a large number of mask layers and manufacturing steps. It would be desirable to produce a trench type Schottky diode with a reduced number of process steps and fewer mask layers and to improve its termination structure.

BRIEF SUMMARY OF THE INVENTION

In accordance with the present invention, a novel LOCOS type process is employed for the manufacture of a trench type Schottky device in which a normally expected oxidation for a LOCOS process is eliminated, and in which the normally expected sacrificial oxidation of the trench walls prior to the growth of a gate oxide on the walls is eliminated. The elimination of these steps saves a mask layer and related critical process steps, and, unexpectedly avoids the creation of a disadvantageous "birds beak" oxide at the edge of the trench, thus improving device characteristics of reverse leakage distribution and improving yield.

More specifically, in the manufacture of a rectifier rated at about 20 volts for the output rectifier market, a silicon nitride layer is directly grown on the surface of a silicon wafer, without an intervening silicon dioxide pad. A trench mask process step then opens a pattern of windows in the nitride layer, and a trenches etch, including the etch of a termination trench, is carried out. The walls of the trench are then oxidized, without a prior sacrificial oxidation and PR strip step. Following Trench refill and planarization, the nitride is striped in a wet etch to prepare the surface for subsequent metallization. Thus, the benefits of the LOCOS process are employed, but they are modified to reduce the number of process steps, some critical, and to improve manufactureability and device characteristics.

DETAILED DESCRIPTION OF THE DRAWINGS

Figure 1:
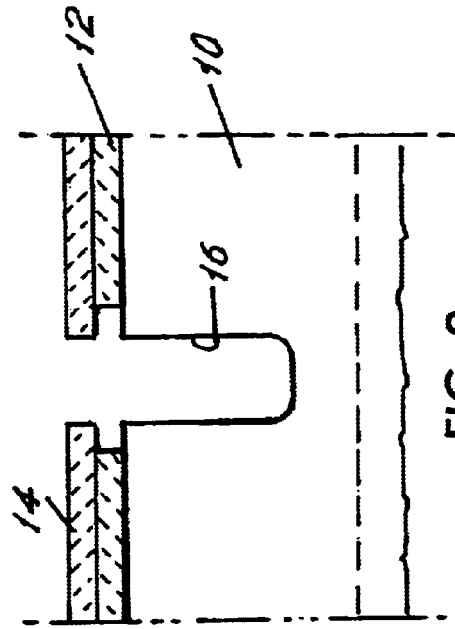
FIG. 1 shows a small portion of a silicon wafer in cross-section after the formation of a pad oxide layer and a nitride layer as in a conventional LOCOS process.
Figure 2:
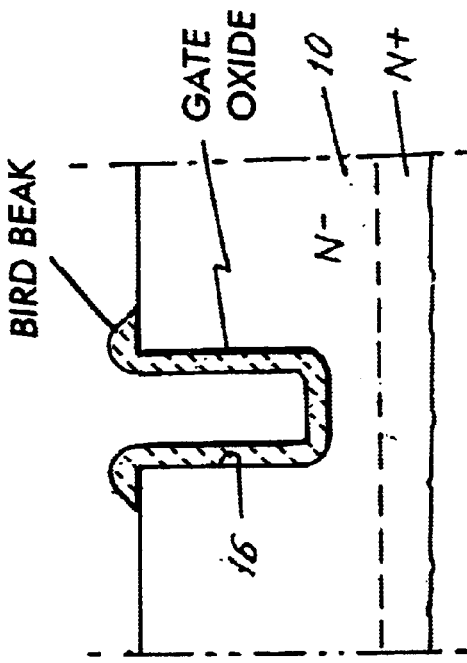
FIG. 2 shows the structure of FIG. 1 after a dry etch of nitride and trench; sacrificial oxidation and wet oxide etch, causing the undercutting of the underlying pad oxide layer.

FIGS. 1 to 4 show applicants' initial attempts to use a LOCOS process to form a trench Schottky device. A starting silicon wafer 10, having an $N^+$ substrate with an $N^-$ epitaxially grown upper surface first receives a conventional pad oxide 12 which is an $SiO_2$ layer which is 200 to 500 Å thick. A nitride layer 14 ($Si_3N_4$) is then deposited atop the oxide pad layer 12. A trench mask is then formed and photolithographically processed to form a plurality of parallel windows. A plurality of parallel trenches, such as the single trench 16 shown in FIG. 2 are then etched into the silicon. A sacrificial oxide is grown, followed by a wet sacrificial oxide etch. During this process, the pad oxide is under etched as shown in FIG. 2. A gate oxide (500 Å) is next grown on the walls of trench 16 and, during this process, the overhanging edges of nitride layer 14 are pressed upwardly by the oxide growing in the undercut spaces. The nitride layer 14 is next stripped, polysilicon is deposited, doped with Boron, and etched back. The pad oxide is etched, leaving the bird beak shown in FIG. 4 at the top edges of the trench. The bird beak degrades the leakage characteristics of a completed device.

In accordance with the invention, it has been found that the pad oxide and sacrificial oxide steps can be eliminated without degrading device characteristics, and simplifying the manufacturing process.

Figure 5:
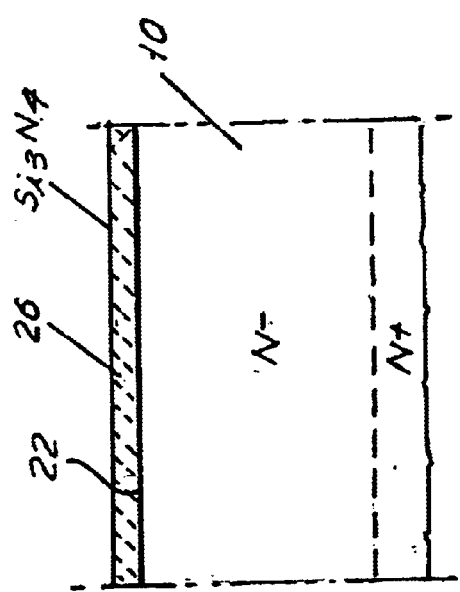
FIG. 5 shows the wafer portion of FIG. 1 in which the nitride layer is formed directly on the silicon, without a pad oxide.

FIGS. 5 to 11 illustrate the inventive fabrication process of a Schottky diode in a detailed manner and the novel resulting device. The process described is for a 20 volt device, but will apply to any device rating with suitable changes. As shown in FIG. 5, a wafer 10 a silicon thickness ranging from 2.5 um to approximately 4 um and with a resistivity between 0.3 and 0.5 ohm cm. The wafer is cleaned for example, by hydrofluoric (HF) acid. HF treatment removes thermal and native oxides.

The layout patterns to be formed are transferred from photomasks to the surface of a silicon wafer using the conventional photolithography process which uses a plurality of masking layers, each of which must be carefully aligned with respect to the previous pattern on the wafer layer. Typically, to provide such an alignment, a so-called zero or foundation layer is formed atop the wafer. The zero layer is an initial layer (which is typically the pad oxide layer of FIG. 1) formed on a wafer. One of the most commonly used commercial alignment methods utilizing a stepper includes placing several alignment marks along the scribed lines in the X and Y directions to improve the alignment accuracy. However, this increases the production cost.

Applicants have realized that it is possible to avoid forming this zero mask and to directly deposit a removable nitride layer at a thickness of approximately 600 Å, as by a low-pressure chemical vapor deposition technique (LPCVD), directly atop the surface 22 of the epi layer 26, as illustrated in FIG. 5. Accordingly, by avoiding the formation of the oxide zero mask, the overall production cost of the inventive structure is reduced.

To form the trenches, a mask layer (not shown) is formed on the surface of the $Si_3Ni_4$ layer 26 and patterned by a suitable photolithographic process, wherein the mask contains a desired trench pattern.

Figure 6:
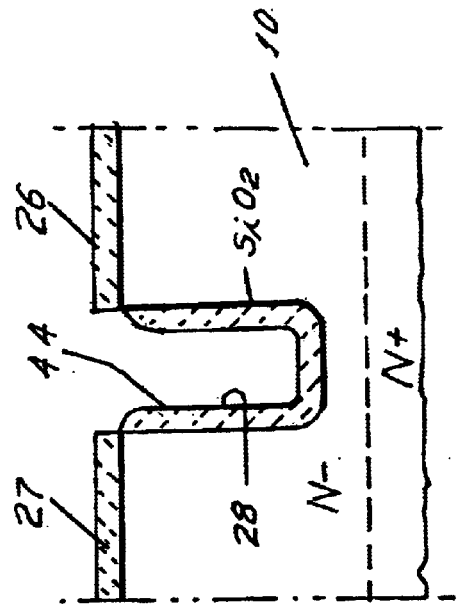
FIG. 6 shows the wafer portion of FIG. 5 after the etch of a groove and the growth of the gate oxide (without the sacrificial oxide step).

As shown in FIG. 6, trenches are formed in the layer 26 using a suitable etching process, such as plasma etching. As a result, a plurality of spaced trenches 28, 30 (FIGS. 6 to 11), which are preferably arranged in parallel spaced stripes extend downwardly from the top side 22 of the epi layer and into the epi layer. A termination trench region 30 (FIG. 11) can also be formed at this step. Trenches 28 and 30 have a width of about 0.5 microns, a spacing of about 0.5 microns and a depth of 1.5 microns. Note that other known trench formations and etching techniques can be utilized.

Once the trenches are formed, the remaining portion of the photoresist mask is stripped, and the exposed surfaces of the trenches undergo a pre-diffusion cleaning step.

Summarizing the above-disclosed sequence of steps, the inventive process successfully avoids forming a pad oxidation layer.

Figure 3:
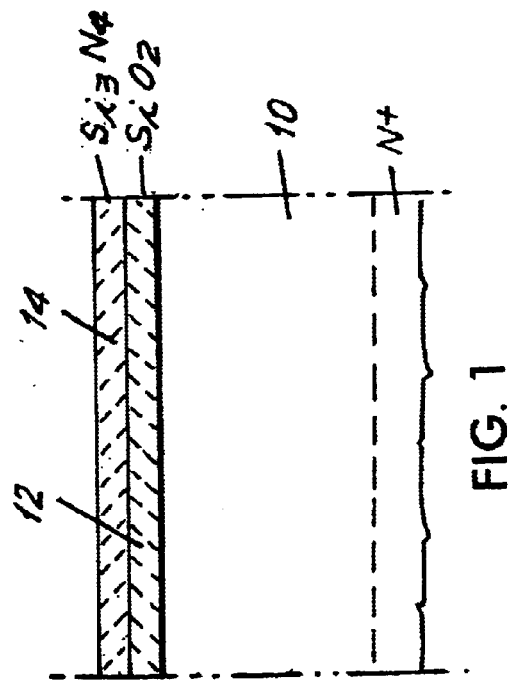
FIG. 3 shows the structure of FIG. 2 after the growth of a gate oxide layer on the trench walls.
Figure 4:
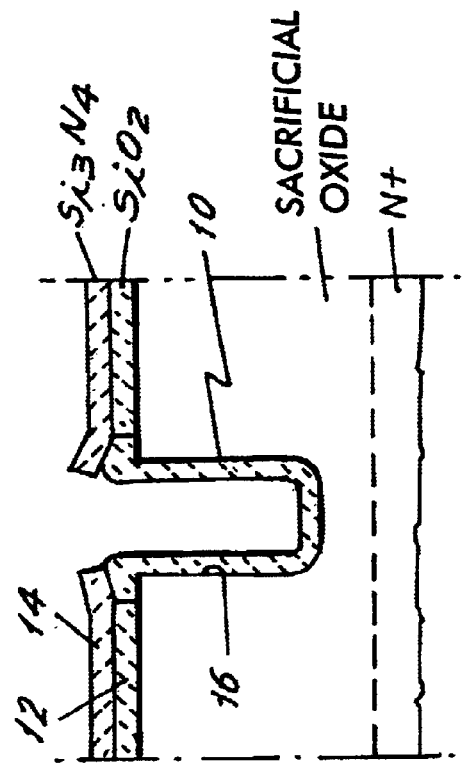
FIG. 4 shows the structure of FIG. 3 after the removal of the nitride, poly deposition, boron implant and drive-in, polysilicon etch back, and a subsequent pad oxide etch, resulting in a birds beak structure.

A further critical distinction of the inventive process over the known fabrication processes is the elimination of the sacrificial oxide layer of FIG. 3. As mentioned above, the Applicants have found that these two steps conventional can be eliminated and, in fact, are detrimental to the quality of trench Schottky barrier structures.

Accordingly, the inventive process next provides a gate oxidation step, as shown in FIG. 6, without growing and etching the sacrificial oxide layer. At this stage of the process, a thin uniform final gate oxide layer 44 having a thickness of approximately 500 Å is grown on the walls of the trench using a wet or dry process.

Figure 7:
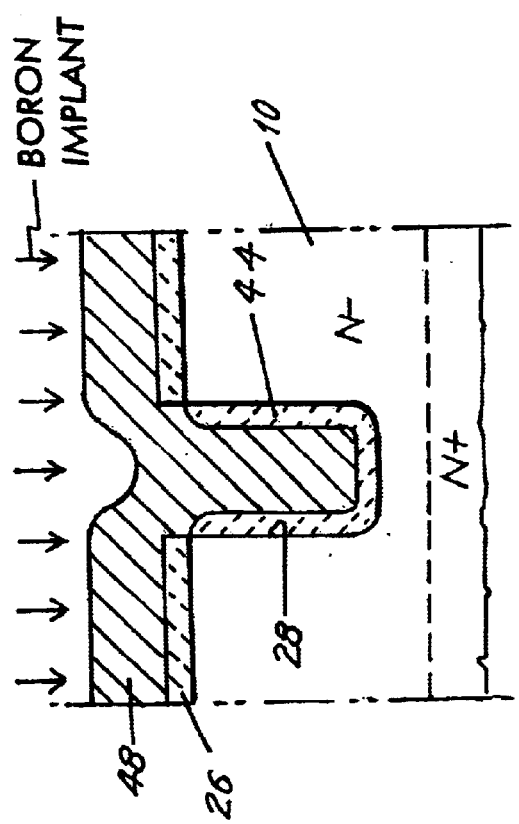
FIG. 7 shows the structure of FIG. 6 after the deposition of a polysilicon layer which fills the trench and a boron implant into the polysilicon.

Next, a layer of an un-doped polysilicon 48 is deposited above the previously prepared structure to a thickness of approximately 7500 Å to fill the trenches, as shown in FIG. 7.

A boron implant, for example, $1E14/cm^2$ at 80 kev is applied to the surface of the device. Any implant species that acts as a P-type dopant can be used. Among these dopants, Boron or $BF_2$, are most common.

Then, after yet another pre-diffusion clean, the implanted species are activated and driven at 1050° C. for one hour to make the polysilicon P type conductive within the trenches. As a result of the P type polysilicon 48, a plurality of electrodes are formed between trenches 28 and mesas 30 which deplete the charge in the N⁻ mesas between trenches under reverse bias to block reverse voltage.

Figure 8:
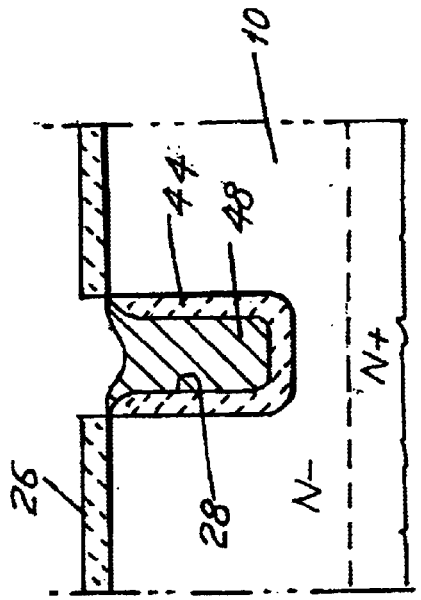
FIG. 8 shows the structure of FIG. 7 after the etch of the polysilicon.
Figure 10:
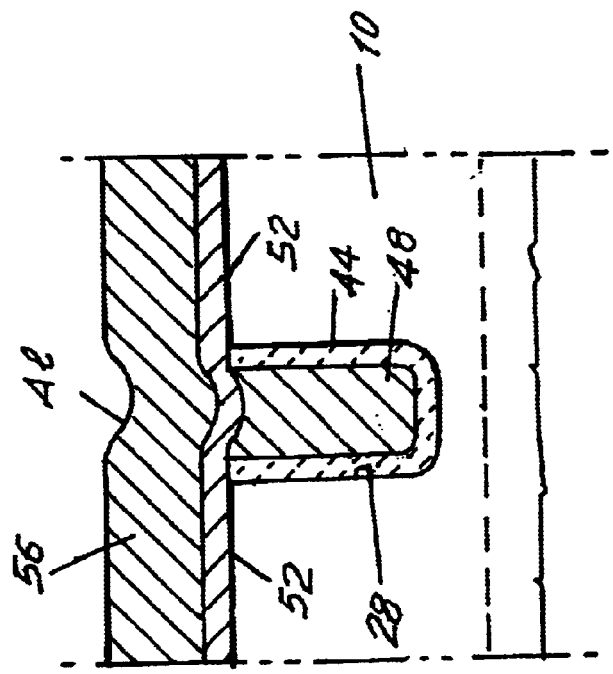
FIG. 10 shows the structure of FIG. 9 after the annealing of the barrier metal, etch of unreacted titanium and the formation of a metal mask.

A blanket poly etch is next carried out as shown in FIG. 8 by a suitable plasma etcher for a period of time lasting for approximately five more seconds than it would be necessary to remove the polysilicon on the device surface. Following the poly etch step the nitride layer covering mesa regions is stripped by a wet etch in a phosphoric acid at 150° C.

Bird beaks are not eliminated with an additional mask as in conventional LOCOS process. The benefit from elimination of bird beaks is reduced leakage, yield increase and thus cost reduction.

Figure 9:
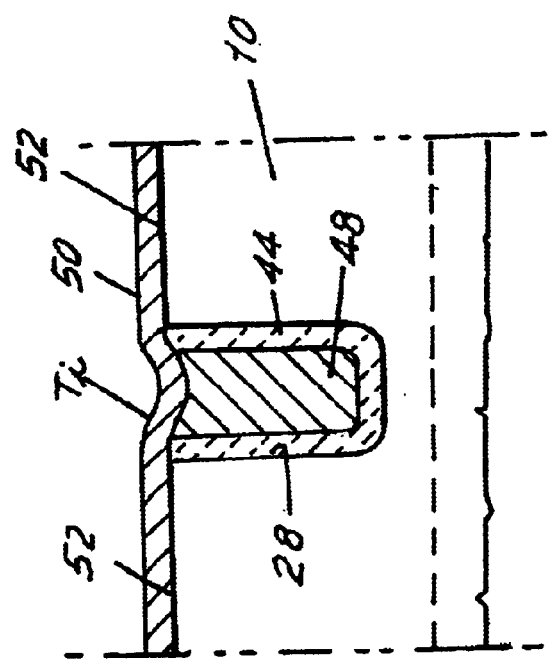
FIG. 9 shows the structure of FIG. 8 after the deposition of a barrier metal (titanium).

Next, referring to FIG. 9, the top face 22 is cleaned by any desired pre-metal clean can then be used. A barrier metal 50, such as titanium, or titanium-tungsten (TiW), etc. is next sputtered on the surface at a thickness of approximately 600 Å. Any technique can be used for titanium deposition; sputtering and electron beam evaporation are the most common techniques. Any thickness of the titanium layer can be used but preferably the Ti layer is about 600 Å thick to maximize the thickness of the subsequent silicide layer, and minimize the thickness of the un-reacted titanium.

The layer of titanium is then annealed at a high temperature in an inert atmosphere. As a consequence, the thin titanium layer reacts with the active-device region to form a titanium suicide layer over the active region, forming Schottky contacts 52 which extend over the tops of mesa regions 54. The non-reacted titanium layer extending along the termination region 21 may then be removed by etching the inventive structure with any known Ammonium Hydroxide and Hydrogen Peroxide-based solution. Etch time can vary, but etch temperature should not exceed 80° C. to avoid excessively fast decomposition of the $H_2O_2$.

A contact metal layer 56 (FIG. 10) which may be a layer of aluminum or other conductive metal layer is next deposited on the top of the inventive structure. A metal mask (not shown) is applied for further etching to remove partly a peripheral portion 58 (FIG. 11) of the top metal within the termination trench region 60.

Finally, the entire wafer is attached to a frame of a grinding device (not shown) via an adhesive tape and a back-grind is carried out, thinning the wafer to 8 mils, after which the work piece is detaped and etched to smooth out roughened surfaces as a result of grinding. A backside metal such as a trimetal Ti/Ni/Ag is sputtered on the bottom of the wafer to form a cathode electrode on the bottom surface of the inventive Schottky rectifier. The wafer may then be diced along scribe lines to separate a plurality of identical diodes.

Figure 11:
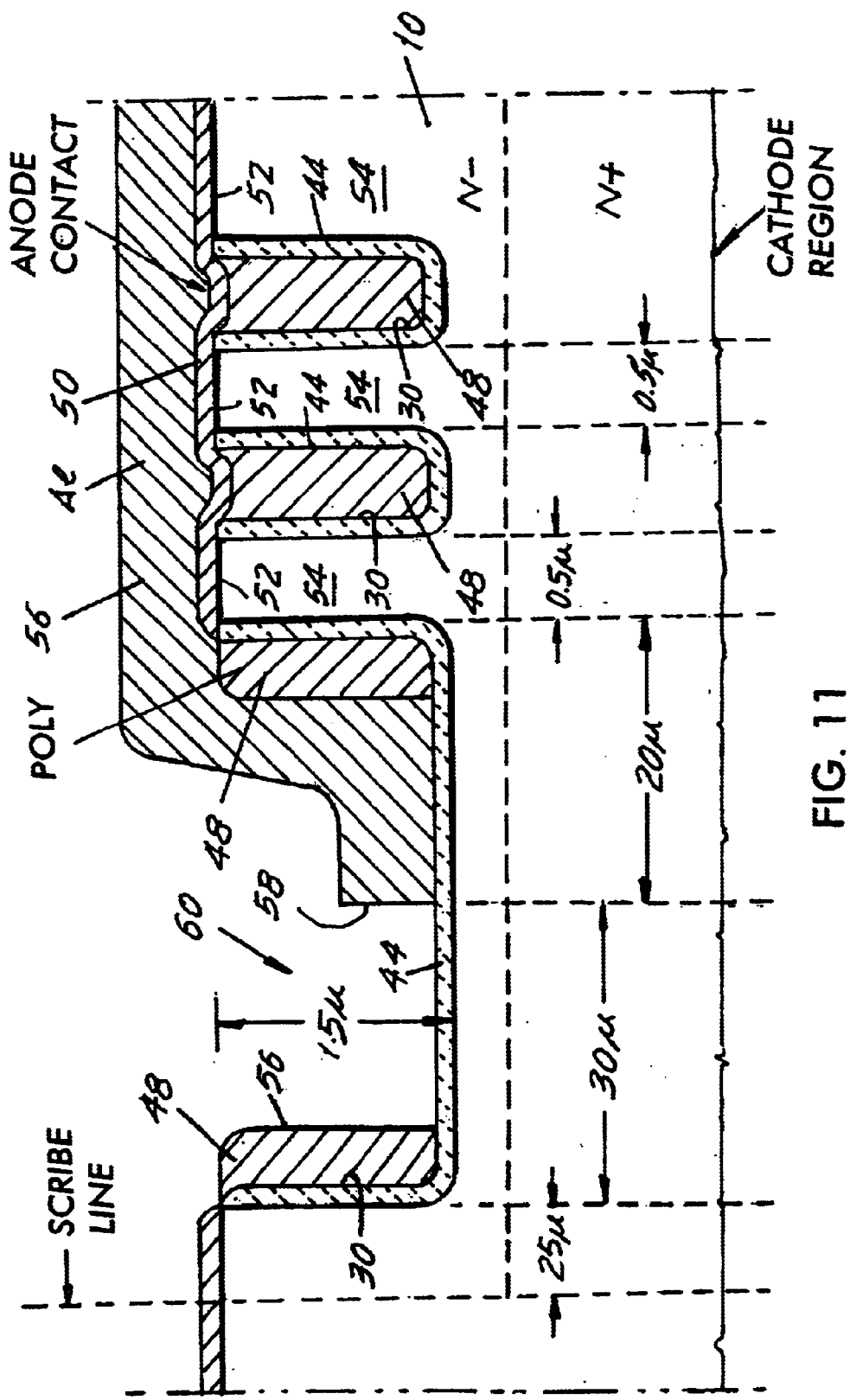
FIG. 11 shows a cross-section, like that of FIG. 10 and shows a further area of the wafer including a parallel trench in the active area and a termination trench.

In the embodiment of FIG. 11, the silicon dioxide 44 in trench 60 has the same thickness as the gate oxide, of about 500 Å. This very thin oxide may rupture in temperature cycling at the bottom of peripheral portion 58 of aluminum contact 58 and at region "x". This may be prevented by using a thicker oxide, for example, 750 Å to 1000 Å or, using an added mask step, by a TEOS layer of 5000 Å thick. Alternatively, a barrier layer of titanium tungsten about 3500 Å thick (non-critical) can be formed to protect the gate oxide 44 in the termination region, by a sequential deposition of TiW and Al during contact metal formation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for fabricating a trench Schottky barrier semiconductor device, comprising the steps of: forming a nitride layer directly on a face of a silicon substrate having a first conductivity type; patterning the nitride layer to define spaced windows and then etching through the windows to form spaced trenches extending downward from the face into the silicon substrate; and lining the interior walls of the trenches with a final oxide layer without forming and etching a sacrificial oxide layer to prevent formation of bird beaks at tops of the interior walls of the trenches.

2. The method defined in claim 1, further comprising filling the trenches with a conductive material of a second conductivity type; forming a Schottky metal layer atop and in contact with the face; and forming anode and cathode electrodes across and in contact with the Schottky metal layer and an opposite face of the silicon substrate, respectively, wherein the windows are opened by etching through the nitride layer and through spaced regions of the silicon substrate juxtaposed with the windows to form alternating trenches and mesas.

3. The method defined in claim 1, wherein the step of filling the trenches with the conductive material of the second conductivity includes depositing a continuous layer of un-doped polysilicon over the patterned nitride layer and implanting second type conductivity impurities into the un-doped polysilicon layer filling the trenches.

4. The method defined in claim 2, further comprising stripping the nitride layer overlaying the mesas to expose spaced portions of the silicon substrate, the stripping being performed by wet etching in phosphoric acid at 150° C. after lining the interior walls of the spaced trenches with the final oxide layer.

5. The method defined in claim 4, wherein the Schottky metal layer is applied over the exposed portions the silicon substrate atop the mesas and atop the trenches to form a Schottky barrier.

6. The method defined in claim 1, wherein the silicon substrate has a thickness of 2.5–4 um and a resistively of 0.3 to 0.5 ohm cm.

7. The method defined in claim 2, wherein the final oxide layer is grown to a thickness of at most 500 Å.

8. The method defined in claim 3, wherein the un-doped layer is deposited to a thickness of approximately 7500 Å.

9. The method defined in claim 3, wherein implanting of impurities includes applying boron ions to the un-doped silicon layer filling the trenches at concentration of $3 \times 10^{16}$ per $cm^2$, and driving the boron ions into the trenches at 1050° C. for 1 hour to form P-conductivity regions and to provide the semiconductor device with a plurality of p-n junctions between the neighboring mesas and trenches.

10. The method defined in claim 3, further comprising the step of blanket etching of the un-doped polysilicon layer by a plasma etch for a period of time exceeding the end point of the etching for 5 seconds.

11. The method defined in claim 5, wherein the Schottky metal is one of titanium or titanium-tungsten sputtered to a thickness of at most 600 Å.

12. The method defined in claim 11, further comprising the steps of annealing the Schottky barrier layer at 625° C. for a 30 sec interval and selectively etching the annealed Schottky barrier layer.

13. The method defined in claim 1, wherein the silicon substrate has an N-epitaxial layer extending from the one face and terminating below the trenches and an N+ substrate layer extending between the N-epitaxial layer and the opposite face of the semiconductor substrate.

14. A method of forming a trench Schottky barrier device, the method comprising the steps of:

forming a nitride layer on one of the opposite faces of a semiconductor substrate having a first conductivity;

patterning the nitride layer to define spaced windows on the nitride layer;

opening windows in said nitride layer by etching through said windows and through regions of the one face of the semiconductor substrate opposing the windows to form alternating trenches and mesas in the semiconductor substrate;

forming an oxide layer on a bottom surface and sidewalls of the trenches without forming a sacrificial oxide layer to avoid bird beak formations at spaced interfaces between the nitride layer and the semiconductor substrate along the mesa;

depositing a continuous layer of un-doped polysilicon over the nitride layer to fill the trenches with the un-doped polysilicon layer;

implanting a second type conductivity impurities into the non-doped polysilicon layer to provide the polysilicon layer with the second type conductivity;

stripping the nitride layer overlaying the mesas to expose the semiconductor substrate;

applying a continuous barrier layer over the one face to form a Schottky between the exposed portion of the semiconductor substrate of the mesas and the barrier layer; and applying metal on the opposite faces of the semiconductor substrate to form anode and cathode electrodes of the semiconductor device.

15. The process of claim 1, wherein a termination trench is formed simultaneously with the formation of the spaced trenches; the Schottky metal layer extending only to a portion of said termination trench.

* * * * *